United States Patent
Twu et al.

(10) Patent No.: US 6,878,578 B1
(45) Date of Patent: Apr. 12, 2005

(54) METHOD FOR FORMING A HIGH QUALITY CHEMICAL OXIDE ON A FRESHLY CLEANED SILICON SURFACE AS A NATIVE OXIDE REPLACEMENT

(75) Inventors: Jih-Churng Twu, Chung-Ho (TW); Tsung-Chieh Tsai, Tainan (TW); Roung-Hui Kao, Hsinchu (TW); Chia-Chun Cheng, Tainan (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 355 days.

(21) Appl. No.: 10/134,823

(22) Filed: Apr. 26, 2002

(51) Int. Cl.$^7$ .............................................. H01L 21/336
(52) U.S. Cl. ...................... 438/197; 438/454; 438/216; 438/261; 438/421; 257/288; 257/410
(58) Field of Search ................................ 257/288, 410; 438/197, 216, 261, 421, 454, 591, 595

(56) References Cited

U.S. PATENT DOCUMENTS

| | | | |
|---|---|---|---|
| 5,464,480 A | 11/1995 | Matthews | 134/1.3 |
| 5,727,578 A | 3/1998 | Matthews | 134/61 |
| 5,911,837 A | 6/1999 | Matthews | 134/2 |
| 6,475,893 B2 * | 11/2002 | Giewont et al. | 438/586 |
| 6,503,333 B2 * | 1/2003 | Twu et al. | 134/3 |

OTHER PUBLICATIONS

Wolf, S., "Silicon Processing for the VLSI Era", vol. 3, Lattice Press, Sunset Beach, CA, (1995), p. 438.
Wolf, S. & Tanber, R.N., "Silicon Processing for the VLSI Era," vol. 1, Lattice Press, Sunset Beach, CA, (1986), p. 516.
C.Y. Chang et al., "ULSI Technology," The McGraw–Hill Companies, Inc., New York, NY, pp. 92–93.

* cited by examiner

*Primary Examiner*—Nathan J. Flynn
*Assistant Examiner*—Scott R. Wilson

(57) ABSTRACT

A continuous and integrated cleaning/preparation process is described to condition a silicon surface for the formation of a high quality ultra thin gate oxide described. The process is conducted with the wafer surface immersed in an aqueous solution the composition of which is varied continuously according to the steps of the process. The process includes the initial removal of contaminants and particulates followed by the removal of a native oxide. Next the silicon surface is dressed in the present of both HF and ozone by removing a thin surface layer. Any interfacial contamination or surface structural defects which lay under the native oxide are thereby removed. Next a high quality chemical oxide is grown by the action of the ozone in the aqueous bath. The chemical oxide is found to be of higher purity and structural quality than native oxide and provides a superior passivation of the active surface prior to gate oxidation. The chemical oxide is incorporated into the final gate oxide and, because of it's high quality, results in improved device performance of the final gate oxide.

22 Claims, 4 Drawing Sheets

METHOD FOR FORMING A HIGH QUALITY CHEMICAL OXIDE ON A FRESHLY CLEANED SILICON SURFACE AS A NATIVE OXIDE REPLACEMENT

BACKGROUND OF THE INVENTION (1) Field of the Invention

The invention relates to processes for the manufacture of semiconductor devices and more particularly to processes for forming ultra thin gate oxides for self-aligned gate field effect transistors.

(2) Description of Prior Art and Background to the Invention

Complimentary metal oxide semiconductors(CMOS) field effect transistor(FET) technology involves the formation n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

The basic MOSFET, whether it be NMOS or PMOS is typically formed by a self-aligned polysilicon gate process. An region of active silicon region surface for the device is defined on a silicon wafer by an opening surrounded by field oxide isolation(FOX). A gate oxide is then grown on the exposed silicon regions and a polysilicon gate electrode is patterned over the gate oxide. Source and drain regions are next formed in the active region, typically by ion implantation. The device is completed by depositing an insulative layer over the wafer and forming contacts to the source/drain regions and to the gate electrode through openings in the insulative layer.

The performance of the MOSFET is inversely proportional to the gate oxide thickness. Efforts to enhance performance as well as reduce power consumption have driven gate oxide thicknesses to well below 100 Angstroms. It was originally predicted that the physical limit of gate oxide thickness is somewhere around 30 Å because below this thickness carriers are removed by direct tunneling, faster than they can be supplied by thermal generation (Wolf, S., "Silicon Processing for the VLSI Era", Vol.3, Lattice Press, Sunset Beach, Calif., (1995), p438). However, recent studies by Bell Laboratories scientists now predict that the physical limit is of the order of 5 atoms which translates to about 14 Å for an $SiO_2$ dielectric.

MOSFET devices are currently being developed which have gate oxide thicknesses as low as 20 Å. As one might expect, serious new problems arise when the technology is driven to such levels requiring the invention of new methods to deal with them. Although some of these problems may not be generally soluble with today's technology, it is prudent to selectively exploit situations where the effects of these problems are minimal.

A problem with this procedure is that a thin layer of native oxide forms on the silicon surface during a non-HF stripping and cleaning processes which remove the photoresist. Native oxide grows quickly and a roughly 10 Angstrom thick layer is formed in the order of minutes and reaches a final thickness of about 30 Angstroms in about a day at room temperature. The native oxide is of poor structural quality and readily absorbs contaminants. Mobile oxide contaminants are known to segregate at the silicon/oxide interface. If the native oxide is left in place during gate oxidation, it's contaminants and structural defects will be incorporated in the gate oxide. If left in place during the formation of a 20 Å thin gate oxide by thermal oxidation, the 10 Å or so of poor quality native oxide would comprise about half of the total. Obviously, a gate insulator with such a large poor quality portion would show degraded performance of the MOSFET. It would therefore be desirable to have a method for reducing native oxide formation on nascent silicon surfaces, as much as possible. The present invention provides a method for providing a clean chemically grown oxide of high quality on the freshly exposed silicon surface during the cleaning process. The oxide is grown by introducing by ozone in the cleaning process. This high quality oxide passivates the silicon surface against subsequent native oxide growth and becomes the base for the subsequently formed gate oxide.

The RCA process, which uses $NH_4OH/H_2O_2$ and $HCL/H_2O_2$ solutions to clean particulates and other chemical residues from silicon wafers, was first introduced in 1970 by Keen and Poutinen at RCA and is well known in the art. Since it's introduction many variations of the process have been developed. Details of this procedure may be found in Wolf, S. and Tauber, R. N., "Silicon Processing for the VLSI Era", Vol.1, Lattice Press, Sunset Beach, Calif., (1986), p.516.

In the RCA process The first ammoniacal peroxide solution (SC-1), when used in concert with the application of ultrasonic or megasonic agitation, is effective for removing organic residues and particulates while the second acidic peroxide solution (SC-2) is effective for removing metallic contaminants. The abbreviations SC-1 and SC-2 are commonly used and refer to standard clean 1 and 2 of the RCA process. A dilute HF treatment is often added between SC-1 and SC-2 to remove silicon oxide.

Matthews, U.S. Pat. No. 5,464,480, U.S. Pat. No. 5,727,578, and U.S. Pat. No. 5,911,837 show an apparatus and a version of the RCA cleaning process wherein ozone is used in place of the peroxide in the SC-1 and SC-2 solutions and in water rinses to provide active oxygen for the removal organic contaminants such as photoresist residues.

SUMMARY OF THE INVENTION

It is an object of this invention to provide a method for forming a high quality silicon oxide layer on a freshly etched nascent silicon surface to passivate the surface and prevent the subsequent formation of a native oxide.

It is another object of this invention object of this invention to provide a method for forming a high quality silicon oxide layer on a silicon surface directly after the silicon surface is exposed by etching with HF in an aqueous solution while said wafer remains immersed in the aqueous solution.

These objects are accomplished by immersing a silicon wafer in an aqueous solution while the composition of the solution is sequentially altered. The solution is continuously flowed through a bath containing the wafer. Initially the solution contains HCl and DI (de-ionized) water. Then, following a prescribed timing sequence, HF is gradually added to the flowing bath while at the same time the HCl concentration is diminished. The HF concentration is maintained for a sufficient time to remove all native oxide from the silicon surface. Ozone is then added to the flowing bath and after a period of time, both HCl and HF concentrations are reduced to zero while the ozone level reaches a maximum. Finally, the ozone flow is removed to a final flow of DI water only. During the time that both HF and ozone are flowing, a minute amount of the silicon surface is removed, thereby dressing the silicon surface by providing a fresh nascent silicon surface which is free of any impurities or structural imperfections which may have been imparted under the native oxide. When the HF concentration is reduced to zero, a clean chemical oxide is formed on the nascent silicon surface by a chemical oxidation process.

DESCRIPTION OF THE PREFERRED EMBODIMENTS

Figure 1A:
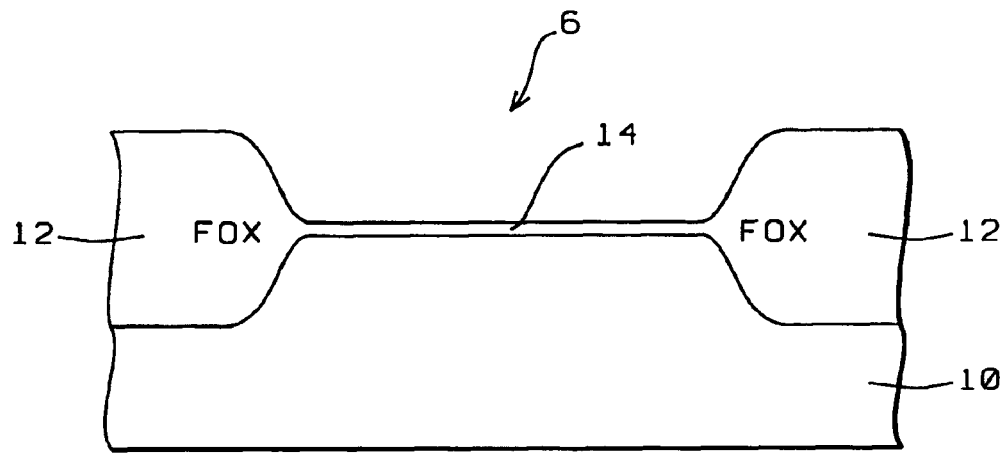
FIG. 1A through FIG. 1E are cross sections illustrating processing steps for the sequential in-situ removal of native oxide, nascent silicon surface preparation and formation of a high quality silicon oxide.

In an embodiment of this invention an active silicon region is defined on a p-type silicon wafer by a field oxide isolation (FOX). Referring to FIG. 1A, there is shown a cross section of a p-type monocrystalline silicon wafer 10. A field oxide (FOX) 12 is patterned on the wafer 10 by the well known LOCOS (Local Oxidation Of Silicon) method to surround a region 6 of active silicon, wherein a gate oxide is to be formed. A polysilicon gate MOSFET will then be formed in the region 6. The LOCOS field oxide 12 is grown to a thickness of between about 0.6 and 0.7 microns. According to the LOCUS method, an oxidation mask (not shown) blocks oxidation of the silicon in the active region. The mask is removed after the oxidation by aqueous etching leaving the silicon wafer exposed in the active region 6. It now becomes necessary to form a thin gate oxide layer over this exposed silicon.

After initially exposing silicon in the active region 6, upon removal of the oxidation mask after formation of the field oxide 12, a native oxide layer 14 quickly forms when the wafer is exposed to atmosphere. Just prior to gate oxidation, the wafer 10 is subjected to a cleaning process wherein the native oxide 14 is removed, the exposed silicon surface is dressed, and a clean high quality chemical oxide is formed. The cleaning process, which includes removing the native oxide 14, dressing the silicon surface, forming a chemical oxide, is the key feature of this invention an will now be described.

The cleaning process takes place in a conventional, single bath, wet cleaning station wherein the wafer is immersed in a tank containing a continuously flowing aqueous cleaning solution. The chemical composition of the cleaning bath in the tank is controllably changed over time by adding and removing components to the solution flow before it enters the bath. This provides a smooth and continuous transition from one stage of the process to the next. The sequence of stages in the continuous cleaning/chemical oxidation process are shown as a flow chart in FIG. 2. The relative concentrations of the bath components in the key stages of the cleaning/oxidation process, which change smoothly as a function of time, is illustrated be FIG. 3. Preferably the solution in the tank is provided with megasonic agitation.

Figure 2:
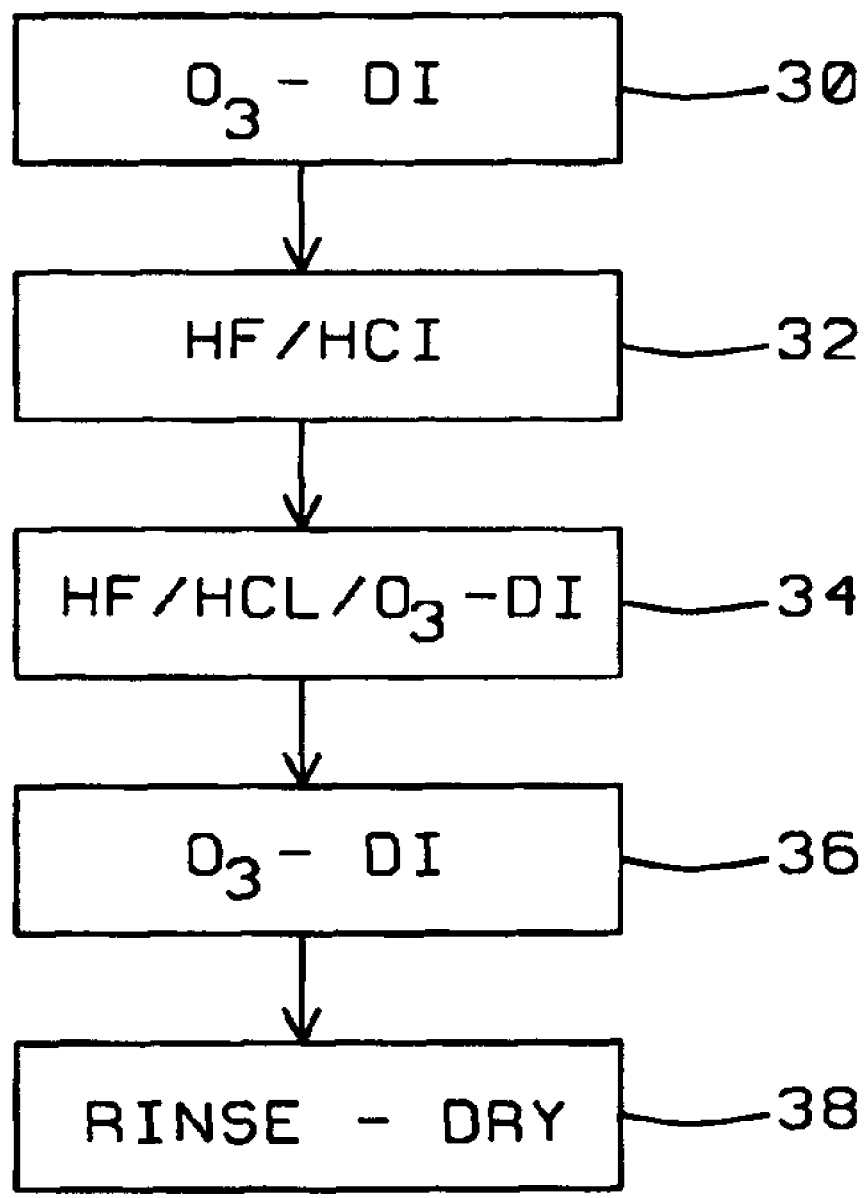
FIG. 2 is a flow chart showing the sequence of processing steps of the present invention.

Initially, DI water flows in the cleaning tank. Referring to FIG. 2, ozone is added to the DI water ($O_3$/DI) flow 30 to oxidize any particulates and organic residues which may be present. The wafer is treated an ($O_3$-DI) flow 20 for a period of between about 20 and 500 seconds after which the $O_3$ addition is stopped and the bath is purged to run pure DI water. Alternately, an ammoniacal hydrogen peroxide solution (SC-1), followed by DI water, may be used in place of $O_3$-DI stage 30 to provide this initial cleaning. This portion of the cleaning process is considered conventional and corresponds to the traditional ammoniacal SC-1 portion of the RCA process and may include the $O_3$ component as taught by Matthews '578. The time line of the current process, illustrated by FIG. 3, begins after the completion of the initial cleaning step 30.

Figure 1B:
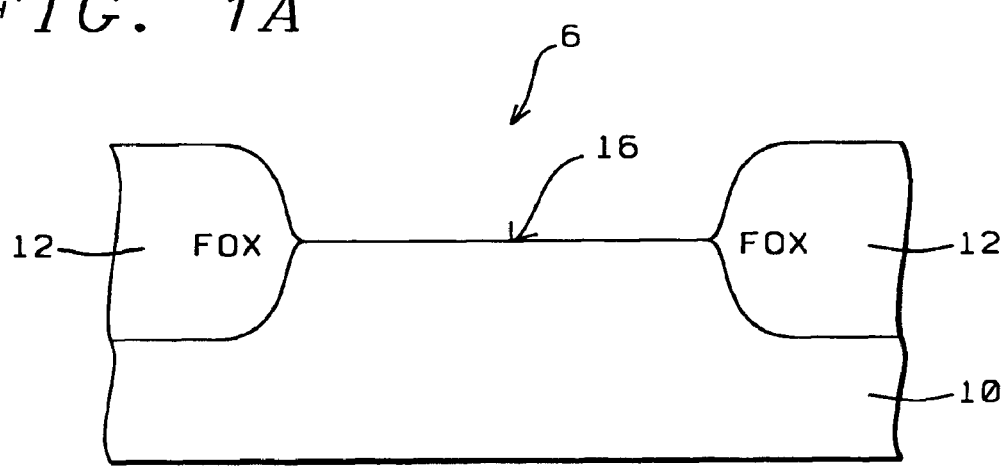
Figure 3:
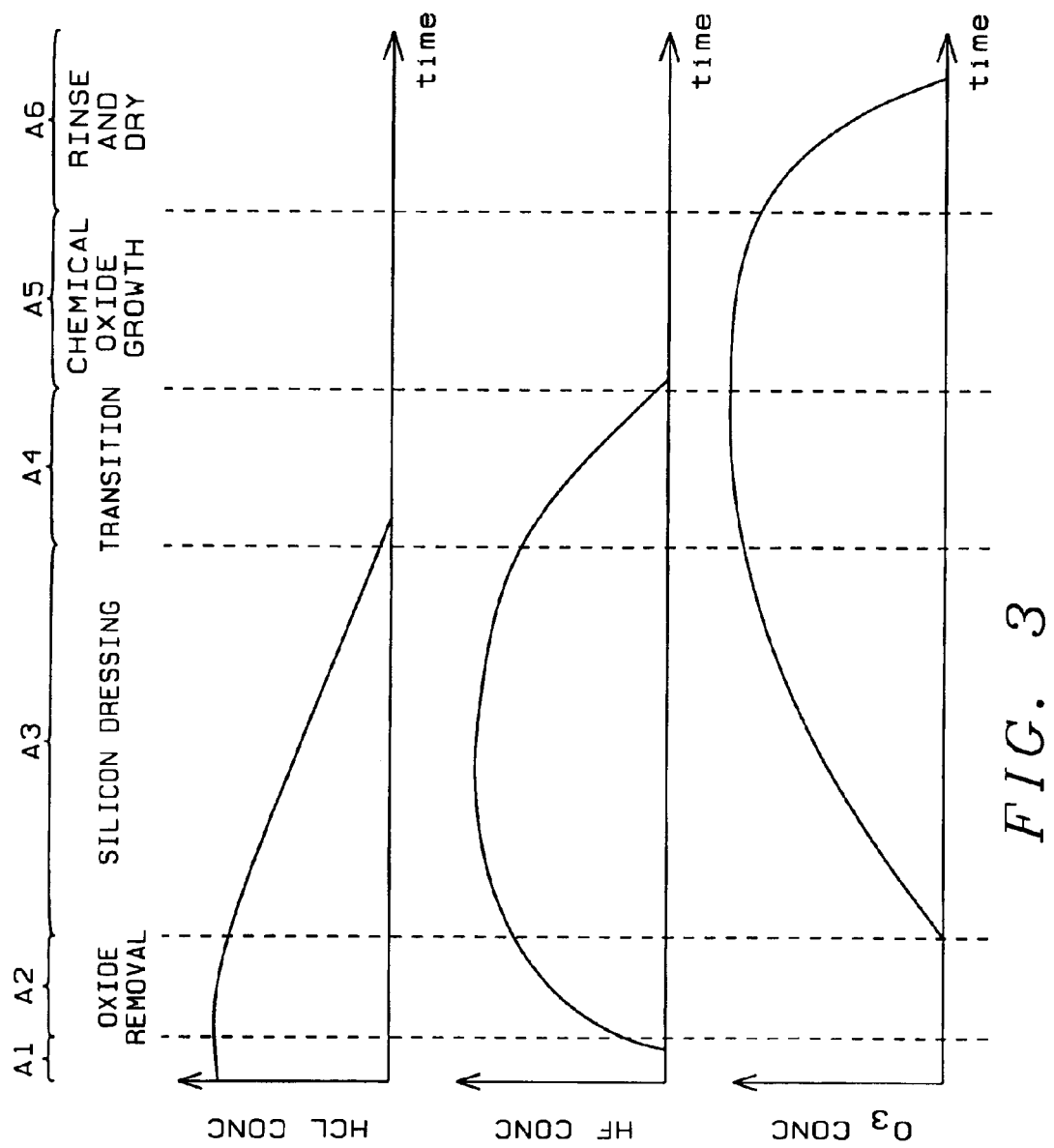
FIG. 3 is a chart showing the relative concentrations of several chemical components in a continuously flowing aqueous bath as a function of time. The chart illustrates the continuously varying composition of the treatment solutions.

Referring to FIG. 3 a HCl is added to the cleaning solution flow to obtain an HCl concentration in the cleaning tank of between about 0.01 and 30 percent HCl by weight. After a period A1 of between about 10 and 500 seconds HF is slowly added to the HCl flow over a period A2 of between about 10 and 500 seconds. During this period A2, the native oxide layer 14 is removed over the active silicon region 6. FIG. 1B shows the silicon surface 16 in region 6 after removal of the native oxide 14. The time periods A1 and A2 correspond to the process step 32 on the flow chart in FIG. 2.

Figure 1C:
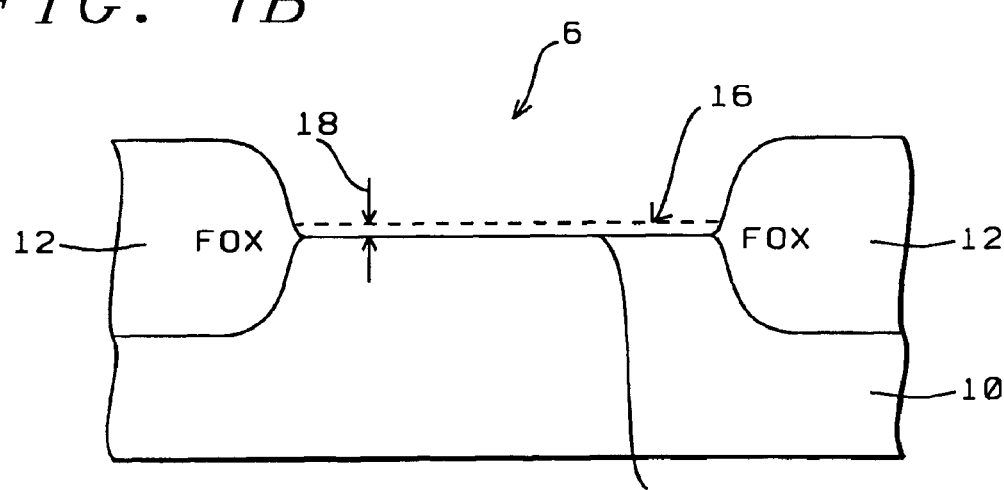

At the completion of the period A2 ozone is added to the solution flow slowly increasing over a time period A3 of between about 10 and 500 seconds, reaching a maximum concentration of between about 0.01 parts per billion and 500 parts per million towards the end of the time period A3. The HCl concentration is correspondingly diminished to zero over this time period. During the period A3, the silicon surface in the active region 6 is dressed by removing a small portion of the exposed silicon surface by simultaneous ozone oxidation and HF dissolution. In FIG. 1C, there is shown the new level 16' beneath the original surface 16 after the silicon removal. The thickness 18 of silicon removed is less than about 10 Angstroms. This dressing of the silicon surface layer removes any embedded impurities and dislocations, providing a fresh, clean, stress free silicon surface upon which the initial portion of a gate oxide is to be formed.

Figure 1D:
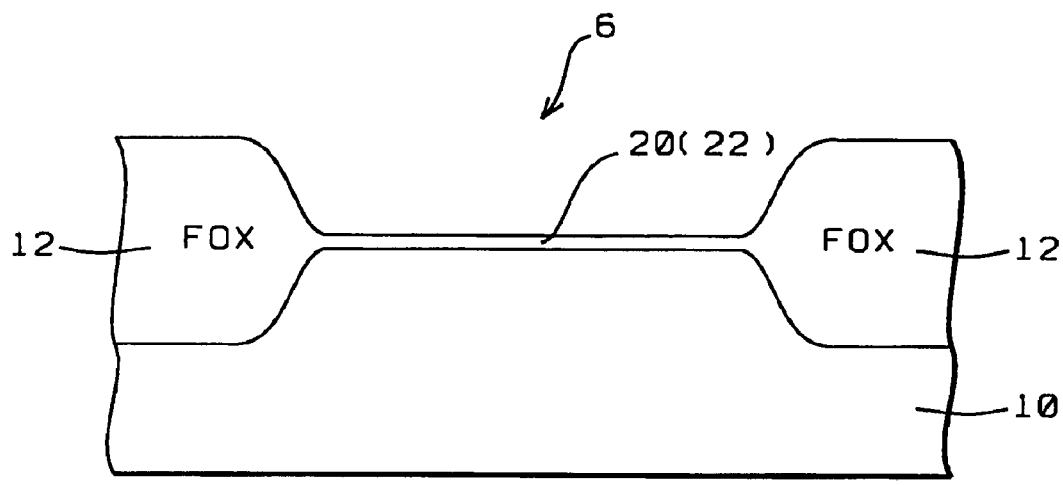

In the time period A4, the HF concentration is reduced to zero, thereby halting the surface dressing process. In period A5 (FIG. 2, step 36), the ozone flow is maintained for a period of between about 10 and 500 seconds with no HF flow. During this period A5, a chemical ozone 20 (FIG. 1D) less than about 10 Angstroms thick is formed over the dressed silicon surface. The time periods A3 and A4 correspond to the process step 34 on the flow chart in FIG. 2. The period A4 is a transition between the silicon dressing A3 period and the chemical oxide growth A5 period. After the chemical oxide is grown, the ozone flow is stopped in Period A6 resulting in a final pure DI water flow at the end of the cleaning process, whereupon the wafer is removed from the cleaning bath and dried 38 (FIG. 2) in the conventional way, for example, by spinning the wafer 10 with the application of isopropyl alcohol.

The chemical oxide is of high purity and density and, as such, is comparable in performance to a thermally grown gate oxide. In addition the chemical oxide passivates the silicon surface, thereby preventing the influx of airborne contaminants as well as conventional native oxide growth.

After drying the wafer 10 is subjected to conventional gate oxidation, whereby an oxide 22, which incorporates the chemical oxide 20 and is grown to a final thickness of between about 8 and 10 Angstroms, preferably in an ambient of dry oxygen. It will be appreciated that the initial chemical oxide contributes a large portion of the total oxide thickness and because it is of higher purity and structural quality than native oxide. During the thermal oxidation, the chemical oxide undergoes some degree of densification and the final gate oxide 22 is of high quality throughout.

Figure 1E:
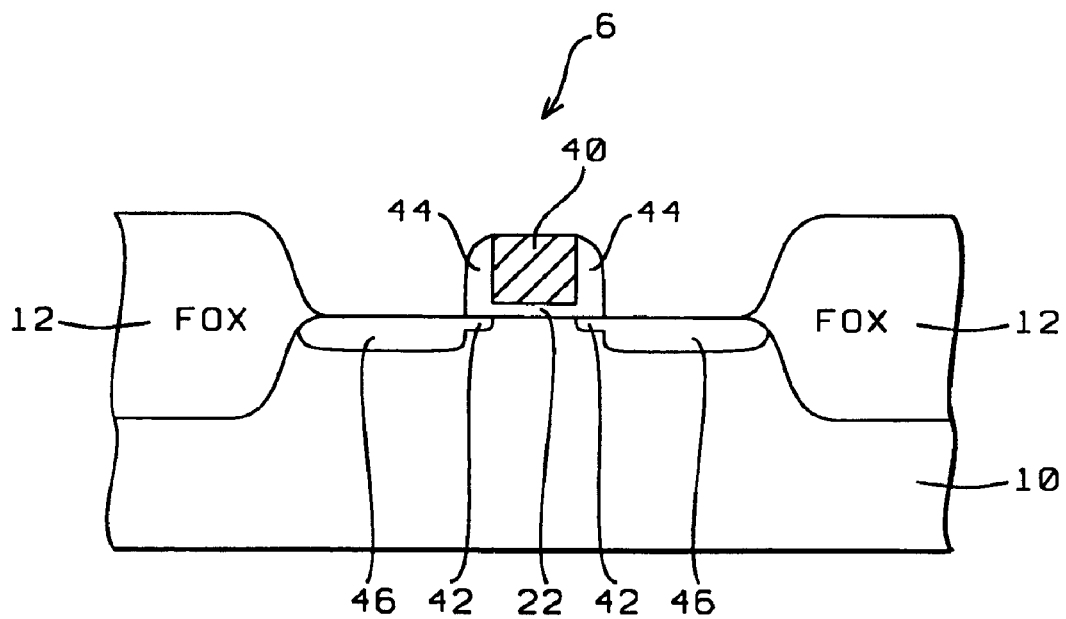

Referring now to FIG. 1E, a polysilicon gate electrode 40 is next patterned over the gate oxide 22 by conventional processing. LDD (lightly doped drain) regions 42 and source/drain regions 46 are next formed by conventional ion implantation processing using sidewall spacers 44. These procedures are well known and widely practiced in the industry and need not be detailed here. The MOSFET is now complete. It remains to deposit an interlevel dielectric layer (not shown) and form source/drain and gate contacts to the respective elements of the MOSFET by the conventional methods.

While the invention has been particularly shown and described with reference to the preferred embodiments thereof, it will be understood by those skilled in the art that various changes in form and details may be made without departing form the spirit and scope of the invention. While the embodiments of this invention utilize a p-type silicon substrate, an n-type silicon substrate could also be used without departing from the concepts therein provided.

While the embodiment of this invention shows treatment and surface preparation steps accomplished by immersing the wafer 10 in a process tank containing an aqueous bath, the aqueous solutions may also be applied by spraying them continuously onto the wafer surface. Processing stations which provide for spray processing of varying concentrations of liquids are commercially available.

In the described embodiment a self-aligned polysilicon gate MOSFET is formed utilizing the gate oxide preparation procedure which is the substance of the present invention. It is to be understood that the method described in the present invention, is not restricted to the manufacture of MOSFETs but may be used other processes where a high quality chemical oxide is desirable.

While the embodiment is illustrated using a LOCOS field oxide to define the active silicon region, it will be appreciated that an alternate field isolation such as STI (shallow trench isolation) could also be used. However, the exposure to HF in the treatment sequence must be minimized in order to prevent excessive erosion of the exposed STI.

What is claimed is:

1. A method for forming a chemical oxide comprising:
   (a) providing a semiconductor structure;
   (b) subjecting said semiconductor structure to a first solution for a first time period;
   (c) purging said first solution with de-ionized water;
   (d) subjecting said semiconductor structure to a second solution containing a concentration of HCl;
   (e) adding to said second solution for a second time period;
   (f) after said second time period, adding ozone to said second solution while diminishing said concentration of HCl to substantially zero and maintaining said HF at a maximum HF concentration, whereby a thickness of silicon is removed from a surface of said semiconductor structure;
   (g) diminishing said HF concentration to substantially zero while maintaining said ozone at a maximum ozone concentration;
   (h) maintaining said maximum ozone concentration for a third time period whereby a chemical oxide is formed on said semiconductor structure.

2. The method of claim 1 wherein subjecting said semiconductor structure to said first and second solutions comprises immersing said structure in a flowing liquid bath of the respective solution.

3. The method of claim 1 wherein subjecting said semiconductor structure to said first and second solutions comprises spraying said solutions onto said semiconductor structure.

4. The method of claim 1 wherein said first solution is selected from the group consisting of de-ionized water containing ozone and de-ionized water containing ammonium hydroxide and hydrogen peroxide.

5. The method of claim 1 wherein said first time period is between about 10 and 500 seconds.

6. The method of claim 1 wherein said second time period is between about 10 and 500 seconds.

7. The method of claim 1 wherein said concentration of HCl is between about 0.01 and 30 percent by weight.

8. The method of claim 1 wherein said thickness of silicon removed is less than about 10 Angstroms.

9. The method of claim 1 wherein said maximum ozone concentration is between about 0.01 parts per billion and 500 parts per million.

10. The method of claim 1 wherein said third time period is between about 10 and 500 seconds.

11. The method of claim 1 wherein the thickness of said chemical oxide is less than about 10 Angstroms.

12. A method for forming an oxide on a semiconductor structure comprising
   (a) providing a silicon wafer having an active region;
   (b) subjecting said active region to a first solution for a first time period;
   (c) purging said first solution with de-ionized water;
   (d) subjecting said active region to a second solution containing a concentration of HCl;
   (e) adding HF to said second solution for a second time period;
   (f) after said second time period, adding ozone to said second solution while diminishing said concentration of HCl to substantially zero and maintaining said HF at a maximum HF concentration, whereby a thickness of silicon is removed in said active region;
   (g) diminishing said HF concentration to substantially zero while maintaining said ozone at a maximum ozone concentration;
   (h) maintaining said maximum ozone concentration for a third time period whereby a chemical oxide is formed on said active region.

13. The method of claim 12 wherein said steps of subjecting said active region to a first and second solution comprises immersing said active region in a flowing liquid bath of the respective solution.

14. The method of claim 12 wherein said steps of subjecting said active region to said first and second solutions comprises spraying said solutions onto said active region.

15. The method of claim 12 wherein said first solution is selected from the group consisting of de-ionized water containing ozone and de-ionized water containing ammonium hydroxide and hydrogen peroxide.

16. The method of claim 12 wherein said first time period is between about 10 and 500 seconds.

17. The method of claim 12 wherein said second time period is between about 10 and 500 seconds.

18. The method of claim 12 wherein said concentration of HCl is between about 0.01 and 30 percent by weight.

19. The method of claim 13 wherein said thickness of silicon removed is less than about 10 Angstroms.

20. The method of claim 13 wherein said maximum ozone concentration is between about 0.01 parts per billion and 500 parts per million.

21. The method of claim 13 wherein said third time period is between about 10 and 500 seconds.

22. The method of claim 13 wherein the thickness of said chemical oxide is less than about 10 Angstroms.

* * * * *

UNITED STATES PATENT AND TRADEMARK OFFICE
CERTIFICATE OF CORRECTION

PATENT NO. : 6,878,578 B1
DATED : April 12, 2005
INVENTOR(S) : Twu et al.

It is certified that error appears in the above-identified patent and that said Letters Patent is hereby corrected as shown below:

Column 5,
Line 59, please insert the word -- HF -- immediately after the word "adding".

Signed and Sealed this

Twenty-eighth Day of June, 2005

JON W. DUDAS
*Director of the United States Patent and Trademark Office*